US009058891B2

(12) United States Patent
Kang

(10) Patent No.: US 9,058,891 B2
(45) Date of Patent: Jun. 16, 2015

(54) EEPROM CELL AND EEPROM DEVICE

(71) Applicant: Electronics and Telecommunications Research Institute, Daejeon (KR)

(72) Inventor: Jin-Yeong Kang, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 29 days.

(21) Appl. No.: 13/963,330

(22) Filed: Aug. 9, 2013

(65) Prior Publication Data

US 2014/0192600 A1    Jul. 10, 2014

(30) Foreign Application Priority Data

Jan. 4, 2013    (KR) .......................... 10-2013-0001190

(51) Int. Cl.
  *G11C 16/06*    (2006.01)
  *G11C 16/26*    (2006.01)
  *G11C 16/04*    (2006.01)

(52) U.S. Cl.
  CPC .............. *G11C 16/26* (2013.01); *G11C 16/045* (2013.01)

(58) Field of Classification Search
  CPC ........ G11C 16/28; G11C 16/25; G11C 16/10; H10L 27/115
  USPC ............................ 365/185.21, 185.26, 185.05
  See application file for complete search history.

(56) References Cited

U.S. PATENT DOCUMENTS

| 5,430,675 | A | 7/1995 | Yajima et al. |
| 5,457,652 | A | 10/1995 | Brahmbhatt |
| 7,292,475 | B2 | 11/2007 | Kodaira et al. |
| 7,700,994 | B2 | 4/2010 | Roizin et al. |
| 8,730,728 | B2 * | 5/2014 | Kang ....................... 365/185.11 |

FOREIGN PATENT DOCUMENTS

| KR | 1999-0082845 A | 11/1999 |
| KR | 10-0945874 B1 | 3/2010 |

OTHER PUBLICATIONS

Wang, et al. "Scaling tunneling oxide to 50Å in floating-gate logic NVM at 65nm and beyond." Integrated Reliability Workshop Final Report, 2007. IRW 2007. IEEE International. IEEE, 2007: 48-51.

(Continued)

*Primary Examiner* — Huan Hoang
(74) *Attorney, Agent, or Firm* — NSIP Law

(57) ABSTRACT

An EEPROM cell is provided which includes a control gate; a tunneling plate; a floating plate configured to form a capacitor area with the control plate and the tunneling plate; an inverter configured to sense a voltage level of the floating plate; a first transfer gate connected with the tunneling plate and configured to transfer an operating voltage selectively applied from first and second bit lines to the tunneling plate; a protection circuit connected with the inverter and configured to float the inverter at non-read or write/erase operations of an adjacent EEPROM cell; and a second transfer gate configured to transfer an output voltage of the inverter. This configuration is enable to use all the same gate oxide (i.e. 26 Å) and ultra low operation voltages (i.e. ±2V) in EEPROM cell.

20 Claims, 4 Drawing Sheets

(56) References Cited

OTHER PUBLICATIONS

Roizin, et al. "C-flash: An ultra-low power single poly logic NVM." Non-Volatile Semiconductor Memory Workshop, 2008 and 2008 International Conference on Memory Technology and Design. NVSMW/ICMTD 2008. Joint. IEEE, 2008: pp. 90-92.

Wang, et al. "Opportunities and Challenges in Multi-times-programmable Floating-Gate Logic Non-Volatile Memories." Non-Volatile Semiconductor Memory Workshop, 2008 and 2008 International Conference on Memory Technology and Design. NVSMW/ICMTD 2008. Joint IEEE, 2008: 22-25.

Aritome, Seiichi, et al. "Reliability issues of flash memory cells." Proceedings of the IEEE 81.5 (1993): 776-788.

* cited by examiner

EEPROM CELL AND EEPROM DEVICE

CROSS-REFERENCE TO RELATED APPLICATION

A claim for priority under 35 U.S.C. §119 is made to Korean Patent Application No. 10-2013-0001190 filed Jan. 4, 2013, in the Korean Intellectual Property Office, the entire contents of which are hereby incorporated by reference.

BACKGROUND

The inventive concepts described herein relate to an EEROM (Electrically Erasable Programmable Read-only Memory) cell, and more particularly, relate to an EEROM cell including transistor elements having a uniform thickness and an EEROM device.

EEPROM may be a kind of programmable read only memory (PROM), and may be implemented to overcome such a disadvantage of an erasable programmable read only memory (EPROM) that contents stored therein are erased by exposing it to strong ultraviolet light source. Data stored in the EEPROM may be erased by forcing an electric signal to a pin of a chip.

As a nonvolatile memory device, such an EEPROM may be applied to a system on chip, an RFID (Radio Frequency Identification) tag, and so on. The EEPROM may have various storage capacities ranging from dozen of bytes to several gigabytes according to the use. In the event that the EEPROM is used for the RFID, a superior adhesive strength may be required. For this reason, there may be required high-density and small-sized EEPROMs.

A tunneling insulation film (e.g., a tunneling oxide film) of the EEPROM may be formed to be thicker than about 70 angstroms. Thus, there need be reduced a thickness of the tunneling insulation film for a high-density and small-sized EEPROM. Also, there need be integrated thicknesses of tunneling insulation films of elements constituting EEPROM cells.

SUMMARY

One aspect of embodiments of the inventive concept is directed to provide an EEPROM cell which comprises a control gate; a tunneling plate; a floating plate configured to form a capacitor area with the control plate and the tunneling plate; an inverter configured to sense a voltage level of the floating plate; a first transfer gate connected with the tunneling plate and configured to transfer an operating voltage selectively applied from first and second bit lines to the tunneling plate; a protection circuit connected with source of floated the inverter and configured to float the inverter at write and erase operations of an adjacent EEPROM cell; and a second transfer gate configured to transfer an output voltage of the inverter.

In example embodiments, the protection circuit comprises a PMOS transistor configured to supply a power supply voltage to the inverter in response to an externally applied read voltage; and an NMOS transistors configured to supply a ground voltage to the inverter in response to the externally applied read voltage.

In example embodiments, the PMOS transistor has a gate grounded, a source connected with a read voltage line supplied with the externally applied read voltage, and a drain connected with the inverter and the NMOS transistor has a gate connected with the read voltage line, a source grounded, and a drain connected with the drain of the inverter.

In example embodiments, the PMOS transistor transfers a power supply voltage to the inverter in response to the read voltage at a sensing operation and the NMOS transistor transfer a ground voltage to the inverter in response to the read voltage at the sensing operation.

In example embodiments, at remaining operations excluding the sensing operation, the read voltage has a ground voltage level and a source and a drain of the inverter are floated.

In example embodiments, the first transfer gate comprises a PMOS transistor configured to transfer a voltage of the first bit line to the tunneling plate; and an NMOS transistor configured to transfer a voltage of the second bit line to the tunneling plate.

In example embodiments, a positive voltage is applied to the first bit line and a negative voltage is applied to the second bit line.

In example embodiments, when a voltage is applied to one of the first and second bit lines, the other is floated.

In example embodiments, the PMOS transistor has a gate grounded, a source connected with the first bit line, and a drain connected with the tunneling plate and the NMOS transistor has a gate grounded, a source connected with the second bit line, and a drain connected with the tunneling plate.

In example embodiments, outputs of the PMOS and NMOS transistors are prevented from back flow of a signal even though connected to common tunneling plate line.

In example embodiments, the second transfer gate is connected with a first sense gate line and a second sense gate line and transfers an output voltage of the inverter to a sense line.

In example embodiments, the second transfer gate comprises a gate of PMOS transistor connected with the first sense gate line; and an gate of NMOS transistor connected with the second sense gate line. At a sensing operation, a ground voltage is applied to the gate of PMOS transistor through the first sense gate line and a power supply voltage is applied to the gate of NMOS transistor through the second sense gate line.

In example embodiments, the PMOS transistor has a drain connected with the inverter, a source connected with the sense line, and a gate connected with the first sense gate line and the NMOS transistor has a source connected with the inverter, a drain connected with the sense line, and a gate connected with the second sense gate line.

In example embodiments, insulation films in elements constituting the inverter, the first and second transfer gates and the protection circuit have the same thickness.

In example embodiments, the insulation film is an gate oxide film and is formed to have a thickness less than about 70 angstroms.

One aspect of embodiments of the inventive concept is directed to provide an EEPROM device which comprises an EEPROM cell array including EEPROM cells arranged in a matrix of rows and columns, each EEPROM cell having an inverter and a transfer gate, wherein each of the EEPROM cell further includes a protection circuit enabling a tunneling oxide film to be formed with the same thickness as insulation films of the inverter and the transfer gate.

In example embodiments, each of the EEPROM cell comprises a control gate; a tunneling plate; and a floating plate configured to form a capacitor area with the control plate and the tunneling plate, the inverter configured to sense a voltage level of the floating plate, In example embodiments, the protection circuit is connected with a corresponding inverter and floats the corresponding inverter when a corresponding EEPROM cell is not selected.

In example embodiments, the protection circuit supplies a voltage of a drain and a source of an inverter only at a read mode and comprises a PMOS transistor configured to supply a power supply voltage to the inverter in response to an externally applied read voltage; and an NMOS transistor configured to supply a ground voltage to the inverter in response to the externally applied read voltage.

In example embodiments, the PMOS transistor has a gate grounded, a source connected with a read voltage line supplied with the externally applied read voltage, and a drain connected with the inverter and the NMOS transistor has a gate connected with the read voltage line, a source grounded, and a drain connected with the inverter, the read voltage having a ground voltage level at remaining operations excluding the sensing operation.

BRIEF DESCRIPTION OF THE DRAWINGS

The above and other objects and features will become apparent from the following description with reference to the following figures, wherein like reference numerals refer to like parts throughout the various figures unless otherwise specified, and wherein.

DETAILED DESCRIPTION

Figure 1:
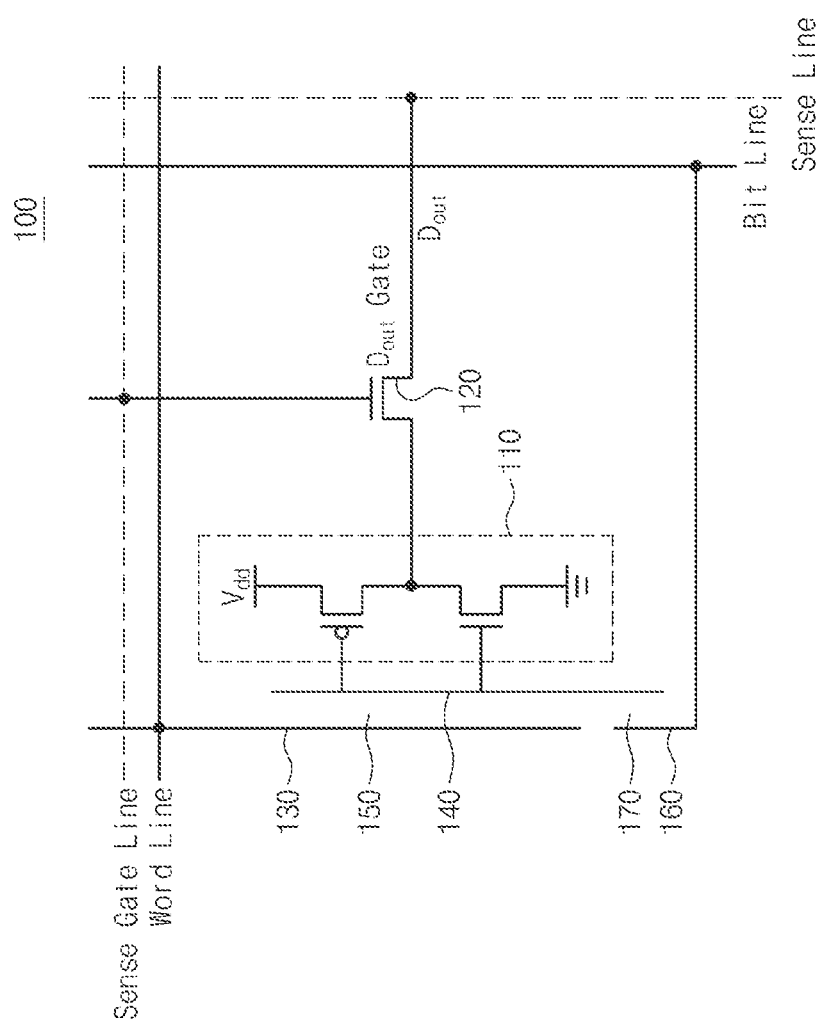
FIG. 1 is diagram schematically illustrating a typical EEPROM cell structure.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is diagram schematically illustrating a typical EEPROM cell structure. Referring to FIG. 1, an EEPROM cell 100 may include an inverter 110 and a data output MOSFET 120. The EEPROM cell 100 may further include a control plate 130 connected with a word line, a floating plate 140 connected with a gate of the inverter 110, a control capacitor area 150 formed between the control plate 130 and the floating plate 140, a tunneling plate 160 connected with a bit line, a tunneling capacitor area 170 formed between the floating plate 140 and the tunneling plate 160.

The inverter 110 may be formed of a CMOS inverter, for example. As illustrated in FIG. 1, the inverter 110 may include a PMOS transistor and an NMOS transistor.

The PMOS and NMOS transistors in the inverter 110 may be connected in series between a power supply voltage terminal and a ground terminal. Gates of the OS and NMOS transistors in the inverter 110 may be connected with the floating plate 140.

A gate of the data output MOSFET 120 may be connected with a sense gate line. A drain of the data output MOSFET 120 may be connected with interconnection of drains of the PMOS and NMOS transistors in the inverter 110. A source of the data output MOSFET 120 may be connected with a sense gate line, and the data output MOSFET 120 may output data through a sense line.

The EEPROM cell 100 may perform write, erase, standby and read/sense operations. The write, erase, standby and read/sense operations may be performed by applying appropriate voltages to the word line, the sense gate line and the sense line.

Data may be written at the EEPROM cell 100 in an order of "standby→erase→standby→write→standby". That is, a standby operation, an erase operation, a standby operation, and a write operation may be sequentially performed to write data at the EEPROM cell 100.

In this case, the EEPROM cell 100 may be written or erased by a shift of electrons due to a voltage difference between both ends of the tunneling capacitor area 170. That is, electrons may be gathered at the floating plate 140 at a write operation of the EEPROM cell 100 by adjusting a voltage across the tunneling capacitor area 170. Also, electrons may be discharged from the floating plate 140 at an erase operation of the EEPROM cell 100 by adjusting a voltage across the tunneling capacitor area 170.

At a standby operation following the write and erase operations, a voltage across the tunneling capacitor area 170 may be minimized such that electrons are not transferred through the floating plate 140.

However, the EEPROM cell 100 may experience data disturbance due to a transfer of electrons even at a standby operation. For example, at a standby operation of the EEPROM cell 100, a voltage of 0V may be applied to the bit line and a voltage between −2V and 2V may be applied to the word line. In this case, electrons may be transferred by a voltage difference between both ends of the tunneling capacitor area 170. That is, electrons may be transferred by a voltage difference between both ends of the tunneling capacitor area 170 at a standby operation of the EEPROM cell 100, so that data disturbance is generated.

In addition, a size of the EEPROM cell 100 may be scaled down, and the ROM cell 100 may be fabricated using a type of thin insulation film to lower a fabrication cost. For example, the EEPROM cell 100 may be fabricated using an oxide film having a thickness of about 26 angstroms as an insulation film.

To fabricate the EEPROM cell 100 using a type of thin insulation film, gates of elements in the EEPROM cell 100 has to be fabricated using a type of thin insulation film. If the EEPROM cell 100 is fabricated using a type of thin insulation film, there may be generated such data disturbance that data stored an unselected EEPROM cell is changed by a write or erase operation of an EEPROM cell adjacent to the unselected EEPROM cell.

To solve the above-described problems, an EEPROM cell structure may be proposed to improve a high-voltage EEPROM with a low-voltage EEPROM when an EEPROM cell is fabricated using a CMOS process (e.g., 65 nm or less). Data disturbance of the EEPROM cell due to a voltage difference between both ends of a tunneling capacitor area may be prevented by using a low voltage.

In the inventive concept, an EEPROM cell with a uniform thickness may be proposed. A thickness of the thinnest tunneling insulation film of a conventional EEPROM cell may be about 70 angstroms. On the other hand, a tunneling insulation film of an EEPROM cell according to an embodiment of the inventive concept may have a thickness of about 26 angstroms. With the inventive concept, it is possible to prevent data disturbance due to a voltage difference between both ends of the tunneling insulation area over having a tunneling insulation film thinner than that of a general EEPROM cell.

Figure 2:
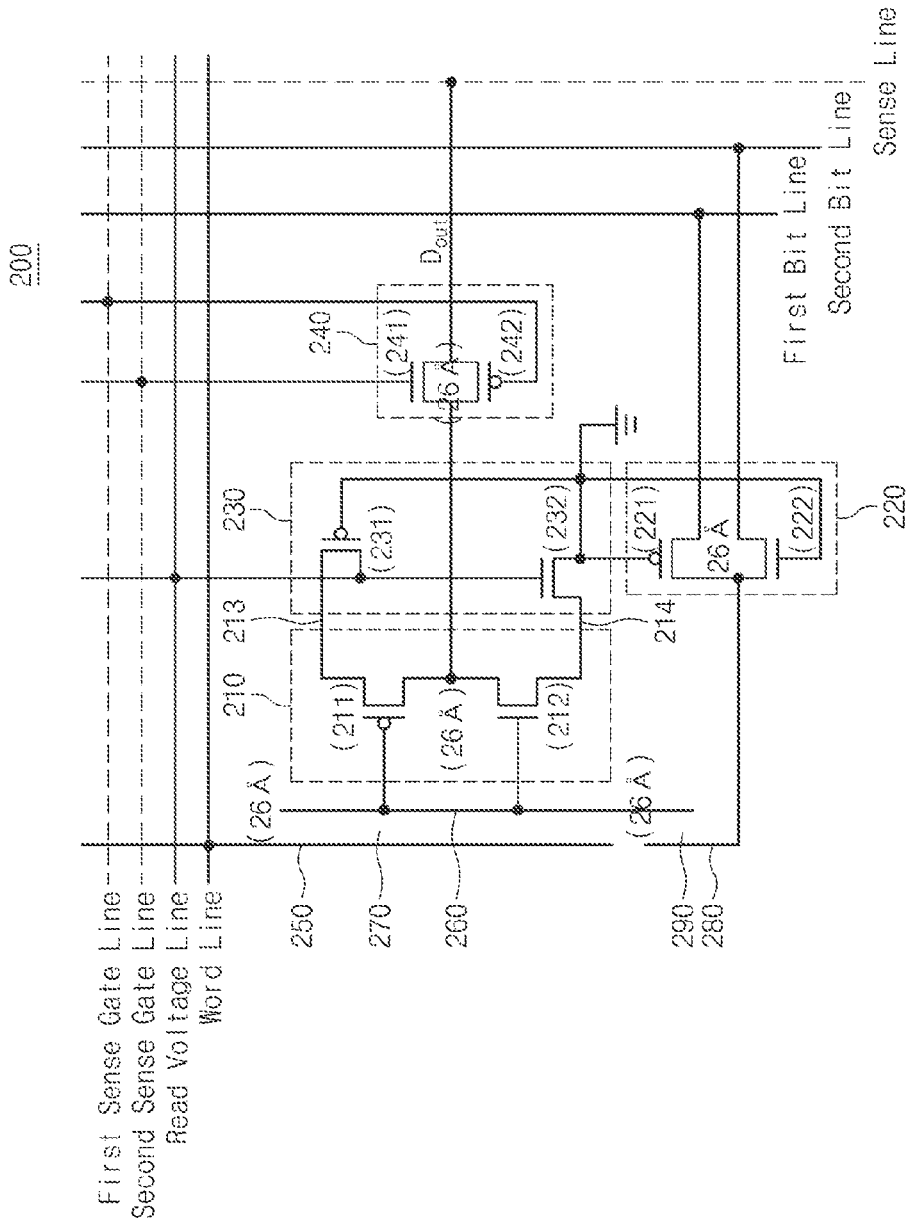
FIG. 2 is a circuit diagram illustrating an EEPROM cell according to an embodiment of the inventive concept.

FIG. 2 is a circuit diagram illustrating an EEPROM cell according to an embodiment of the inventive concept.

Referring to FIG. 2, an EEPROM cell 200 may include an inverter 210, a first transfer gate 220, a protection circuit 230, and a second transfer gate 240.

The EEPROM cell 200 may further include a control plate 250 connected with a word line, a floating plate 260 connected with a gate of the inverter 210, a control capacitor area 270 formed between the control plate 250 and the floating plate 260, a tunneling plate 280 connected with a bit line, a tunneling capacitor area 290 formed between the floating plate 260 and the tunneling plate 280.

Herein, the floating plate 260 may form a capacitor area with the control plate 250.

The inverter 210 may be a CMOS inverter, for example. As illustrated in FIG. 2, the inverter 210 may include a first PMOS transistor 211 and a first NMOS transistor 212 connected in series. Gates of the first PMOS transistor 211 and the first NMOS transistor 212 may be connected with the floating plate 260.

The first transfer gate 220 may be placed between the tunneling plate 280 and bit lines. The first transfer gate 220 may float a voltage approximate to a voltage (e.g., 0V) applied to an unselected bit line. The first transfer gate 220 may include a second PMOS transistor 221 and a second NMOS transistor 222.

Gates of the second PMOS transistor 221 and the second NMOS transistor 222 may be grounded. A source of the second PMOS transistor 221 and a drain of the second NMOS transistor 222 may be connected with the tunneling plate 280. A drain of the second PMOS transistor 221 may be connected with a first bit line, and a source of the second NMOS transistor 222 may be connected with a second bit line.

The protection circuit 230 may be connected with the inverter 210 (e.g., sources of floated the inverter 210), and may suppress data disturbance due to external interference. The protection circuit 230 may include a third PMOS transistor 231 and a third NMOS transistor 232.

A drain of the third PMOS transistor 231 may be connected with a source of the first PMOS transistor 211. A gate of the third PMOS transistor 231 may be grounded. A source of the third PMOS transistor 231 may be connected with a read voltage line. A source of the third NMOS transistor 232 may be grounded (or, connected with intersection of a gate of the third PMOS transistor 231 and a ground). A drain of the third NMOS transistor 232 may be connected with a source of the first NMOS transistor 212. A gate of the third NMOS transistor 232 may be connected with the read voltage line.

A lower well nWell of the third PMOS transistor 231 may be connected with the read voltage line, and a lower well pWell of the third NMOS transistor 232 may be grounded. A well nWell of the first PMOS transistor 211 in the inverter 210 may be connected with a power supply voltage signal line 213, and a well pWell of the first NMOS transistor 212 in the inverter 210 may be connected with a ground voltage signal line 214.

The second transfer gate 240 may be placed between the inverter 210 and a sense line. The second transfer gate 240 may transfer an output voltage $V_{out}$ of the inverter 210 to the sense line. The second transfer gate 240 may include a fourth NMOS transistor 241 and a fourth PMOS transistor 242.

A source of the fourth NMOS transistor 241 and a drain of the fourth PMOS transistor 242 may be connected with interconnection of the first PMOS and NMOS transistors 211 and 212 in the inverter 210. A drain of the fourth NMOS transistor 241 and a source of the fourth PMOS transistor 242 may be connected with the sense line and output data from the inverter 210. A gate of the fourth NMOS transistor 241 and a gate of the fourth PMOS transistor 242 may be connected with a sense gate line.

Below, a data sensing operation of an EEPROM cell 200 will be described with reference to FIG. 2. For ease of description, it is assumed that a voltage of 0V is applied to a first sense gate line and a voltage of 1V is applied to a second sense gate line. Also, it is assumed that a power supply voltage is 1V and a ground voltage is 0V.

At a sensing operation, the second transfer gate 240 may amplify data from the inverter 210 to output the amplified data to the sense line. The second transfer gate 240 may be connected with the first sense gate line and the second sense gate line. At the sensing operation, a voltage of 0V may be applied to the fourth PMOS transistor 242 through the first sense gate line, and a voltage of 1V may be applied to the fourth NMOS transistor 241 through the second sense gate line.

A control circuit (not shown) of the EEPROM cell 200 may sense data output through the second transfer gate 240. A lot of negative charges may exist at a floating gate of a cell at which data is written. In this case, a potential of the floating gate may be lowered, so that a voltage of a floating gate corresponding to a selected word line does not exceed a logical threshold voltage of an inverter in the cell. Thus, a voltage of 1V corresponding to a power supply voltage Vdd may be output.

On the other hand, a lot of positive charges may exist at a floating gate of a cell at which data is not written. In this case, a potential of the floating gate may be high, so that a voltage of a floating gate exceeds a logical threshold voltage of an inverter. Thus, a voltage of 0V corresponding to a ground voltage Vss may be output.

Below, a data write operation and a data erase operation of an EEPROM cell 200 will be described with reference to FIG. 2.

At a write/erase operation of the EEPROM cell 200, the second PMOS transistor 221 of the first transfer gate 220 may transfer a voltage applied to the first bit line to the tunneling plate 280, or the second NMOS transistor 222 220 may transfer a voltage applied to the second bit line to the tunneling plate 280. At this time, if a voltage is applied to one of the first and second bit lines, the other may be floated. Therefore, at a write/erase operation of the EEPROM cell 200, the first transfer gate 220 may not affect the write/erase operation.

At a standby operation of the EEPROM cell 200, a voltage of 0V may be applied to the first and second bit lines. The first transfer gate 220 may separate the first and second bit lines from the tunneling plate 280. In this case, the tunneling plate 280 may be floated during a standby operation of the EEPROM cell 200.

At this time, since a bit line connected with the tunneling plate 280 is divided into the first and second bit lines, the first transfer gate 220 may be connected with a positive external control circuit and a negative external control circuit. In this case, since a positive voltage and a negative voltage are separately received through the first and second bit lines, the tunneling plate 280 may use a low voltage (e.g., half a conventional voltage).

Also, since gates of the PMOS and NMOS transistors 221 and 222 of the first transfer gate 220 are grounded in common, a separate line or a circuit for providing a control signal may not be required.

Herein, a selection signal may not be simultaneously provided to the first transfer gate 220 through the first and second bit lines. That is, any one of the first and second bit lines may be floated (e.g., having a high impedance state).

For example, a voltage ranging from 0V to 2V may be applied to a source of the second PMOS transistor 221 through the first bit line, and a voltage ranging from −2V to 0V may be applied to a source of the second NMOS transistor 222 through the second bit line. At this time, a well nWell of the second PMOS transistor 221 may be connected with a source terminal of an external input of the second PMOS transistor 221, and a well pWell of the second NMOS transistor 222 may be connected with a source terminal of an external input of the second NMOS transistor 222.

A signal may reversely flow when outputs of the bit lines are connected in common with the tunneling plate 280. Nevertheless, since a PN junction of different transistors (e.g., the second PMOS and NMOS transistors 221 and 222) may not be forward biased, so that a current leakage is prevented. That is, since the well nWell of the second PMOS transistor 221 and the well pWell of the second NMOS transistor 222 are respectively connected with external input source terminals, a signal may not flow reversely under such a condition that outputs are connected in common. Thus, at the write/erase operation, the first transfer gate 220 may prevent such a disturbance phenomenon that previously written data is erased.

Below, an operation of the protection circuit 230 will be described.

The protection circuit 230 may receive a power supply voltage Vdd through the read voltage line. For ease of description, it is assumed that a power supply voltage Vdd provided through the read voltage line is 1V. A provided through the read voltage line may be referred to as a read voltage Vread. Also, a level of the read voltage Vread may be set variously.

To implement the EEPROM cell 200 by a thin tunneling insulation film (or, oxide film), the protection circuit 230 may float the inverter 210 when the EEPROM cell 200 is not selected at a write/erase operation. In this case, the protection circuit 230 may float the inverter 210 such that a power supply voltage Vdd and a ground voltage Vss are not applied to the inverter 210.

In detail, the protection circuit 230 may operate responsive to the power supply voltage (or, the read voltage Vread) applied from the read voltage line. As the power supply voltage (or, the read voltage Vread) of 1V is applied to the protection circuit 230 at a write/erase operation, the protection circuit 230 may apply the power supply voltage of 1V and the ground voltage Vss of 0V to the inverter 210. Herein, the read voltage Vread may have a ground voltage level at the remaining operations other than the sensing operation, and the source and the drain of the inverter 210 may be floated.

The power supply voltage of 1V may be transferred to the inverter 210 through the second PMOS transistor 231 of the protection circuit 230.

The second PMOS transistor 231 of the protection circuit 230 may provide the power supply voltage of 1V to the inverter 210, and the NMOS transistor 232 may provide the ground voltage Vss of 0V to the inverter 210. At this time, a voltage of 0V may be applied to the bit line and the word line. Thus, a stable operation of the inverter 210 may be secured.

Although all insulation films are formed to have the same thickness (e.g., about 26 angstroms), tunneling may be prevented. The reason may be that a well is adjacent to a floating gate. Therefore, it is possible to fabricate the EEPROM cell 200 having a thin insulation film. That is, all insulation films of the EEPROM cell 200 may be formed to have the same thickness (e.g., about 26 angstroms) through the protection circuit 230.

With the above description, although all insulation films of the EEPROM cell 200 are formed to have the same thickness (e.g., about 26 angstroms), at a write/erase operation, there may be prevented data disturbance that previously written contents are erased during a standby time. Thus, it is possible to secure a stable operation.

The following table shows voltages of selected and unselected EEPROM cells at standby, erase, write, and sensing operations.

TABLE 1

| Area | Lines | Standby | Erase | Write | Sensing |
|---|---|---|---|---|---|
| Sel. Cell | Word line | +2 V~−2 V | −2 V | 2 V | 0 V |
|  | Bit line | 0 V | 2 V | −2 V | 0 V |
|  | Sense gate line | 0 V | 0 V | 0 V | +1.0 V |
|  | Sense line | High-Z | High-Z | High-Z | Data (V-reading) |
| Unsel. Cell | Word line | −2 V~+2 V | 2 V | −2 V | 0 V |
|  | Bit line | 0 V | 2 V | −2 V | 0 V |
|  | Sense gate line | 0 V | 0 V | 0 V | 0 V |
|  | Sense line | High-Z | High-Z | High-Z | High-Z |
| Internal Inverter | Read voltage line | 0 V | 0 V | 0 V | +1.0 V |

Figure 3:
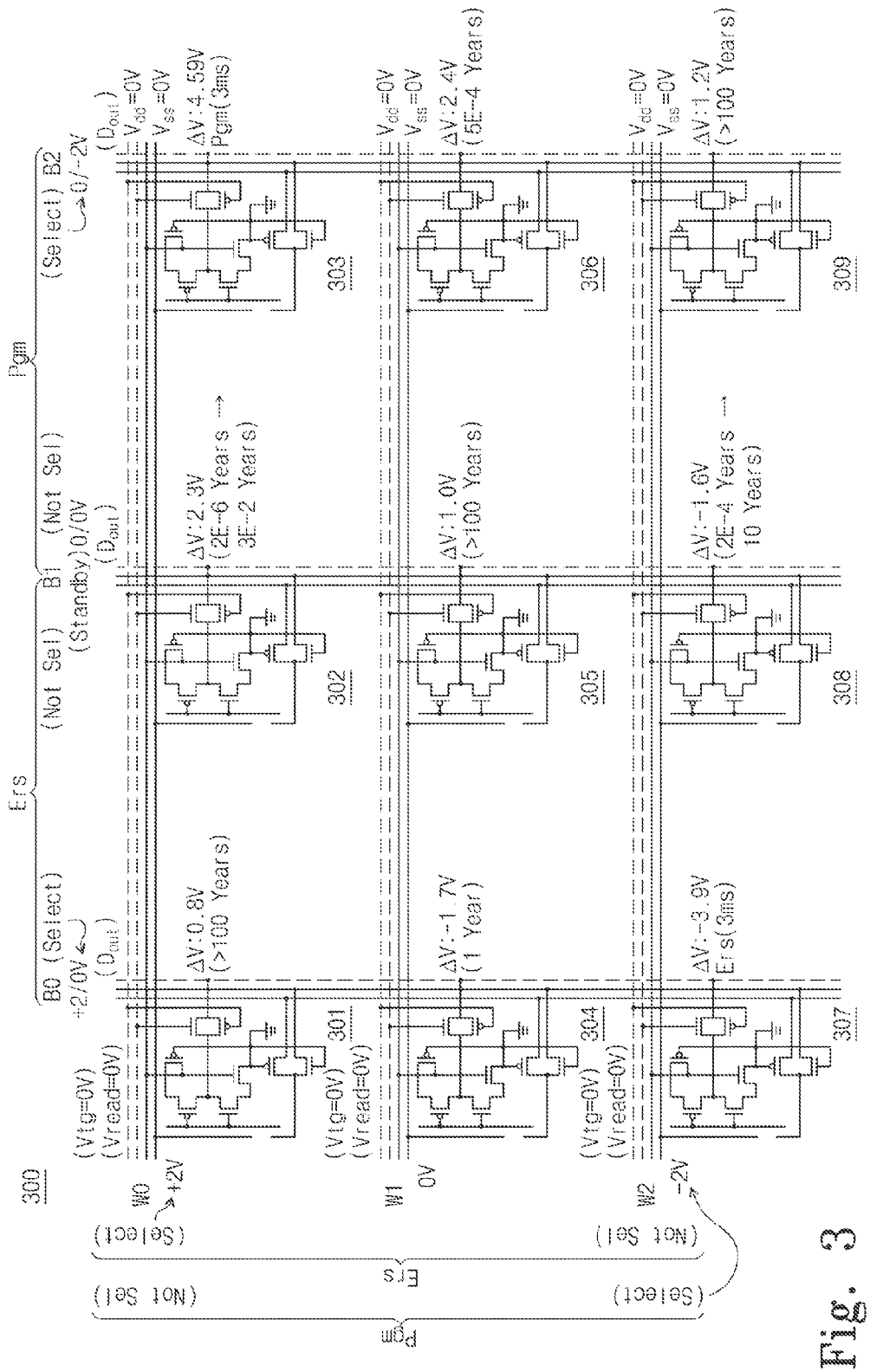
FIG. 3 is a diagram schematically illustrating write and erase operations of an EEPROM cell array according to an embodiment of the inventive concept.
Figure 4:
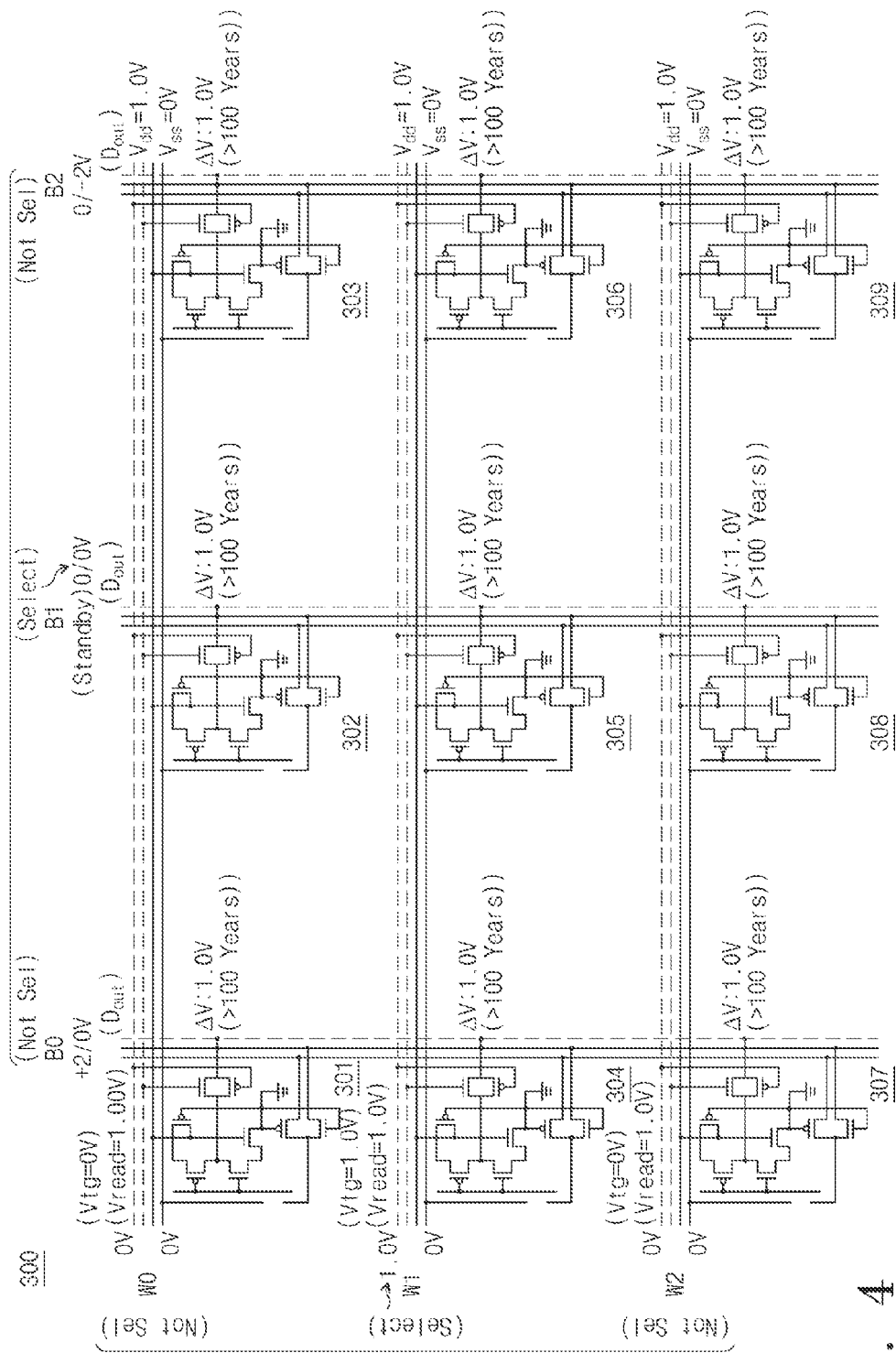
FIG. 4 is a diagram schematically illustrating a sensing operation of an EEPROM cell array according to an embodiment of the inventive concept.

In FIGS. 3 and 4, standby, erase, write, and sensing operations on an EEPROM cell array will be described based on voltages of the table 1. Herein, the EEPROM cell array may be a matrix where a plurality of EEPROM cells is arranged in rows and columns. A memory device including the EEPROM cell array may be referred to as an EEPROM device.

Voltages of the table 1 may be exemplary. Voltages applied to selected and unselected EEPROM cells may be changed variously. Below, it is assumed that voltages of the table 1 are applied to EEPROM cells.

FIG. 3 is a diagram schematically illustrating write and erase operations of an EEPROM cell array according to an embodiment of the inventive concept. Referring to FIG. 3, an EEPROM cell array 300 may include a plurality of EEPROM cells 301 to 309.

The EEPROM cells 301 to 309 may be formed at intersections of three word lines W0, W1 and W2 and three bit lines B0, B1 and B2, respectively. For ease of description, bit lines may be marked by B0, B1 and B2. However, an EEPROM cell may be connected with two bit lines for transferring a positive voltage and a negative voltage.

Herein, ΔV may indicate an initial voltage applied between both ends of a tunneling insulation film, a time marked under the initial voltage may indicate a data duration time.

If an initial voltage is '+', a voltage Vfloat.plate of a floating capacitor plate may be higher than a voltage Vtun.plate of a tunneling capacitor plate. In this case, a previously erased cell may be erased.

If an initial voltage is '−', a voltage Vfloat.plate of the floating capacitor plate may be lower than a voltage Vtun.plate of the tunneling capacitor plate. In this case, a previously written cell may be erased.

Herein, an erase time may indicate the reliability on disturbance generated with respect to a long time. In example embodiments, it may be calculated on the basis of the case that a write/erase threshold voltage difference is reduced by 0.3V.

As illustrated in the table 1, at erase and write operations, a voltage of +2V (selected at a write operation or unselected at an erase operation) or a voltage −2V (unselected at a write operation or selected at an erase operation) may be applied to a word line. At a standby operation, the word line may be set up by a voltage ranging from +2V to −2V. At this time, a bit line may be set up by +2V (erasing), 0V (standby) or −2V (writing). The bit line may be set up by +2V (erasing), 0V (standby) or −2V (writing) regardless of whether it is selected or unselected.

At an erase operation, a voltage of −2V may be applied to a selected word line and a voltage of +2V may be applied to a selected bit line. Also, at the erase operation, a voltage of +2V may be applied to an unselected word line and a voltage of +2V may be applied to an unselected bit line.

At a standby operation, a voltage of +2V may be applied to a word line regardless of whether it is selected or unselected, and a voltage of 0V may be applied to all selected bit lines. Herein, the bit lines may be bit lines receiving a standby command.

At a write operation, a voltage of +2V may be applied to a selected word line, and a voltage of −2V may be applied to a selected bit line. At the write operation, a voltage of −2V may be applied to an unselected word line, and a voltage of 0V may be applied to an unselected bit line.

When a voltage of +2V is applied to a bit line (e.g., a first bit line) and a word line, an EEPROM cell 301 at the first row and first column may be an unselected 'erase operation cell'. In this case, a voltage difference may be typically generated by charges stored at a floating plate 260. For example, in the even that a voltage across a tunneling capacitor area 290 is measured to be 0.8V, data stored at the EEPROM cell 301 may be retained over 100 years.

If a voltage of +2V is applied to a bit line (e.g., a first bit line) and a voltage of −2V is applied to a word line, an EEPROM cell 307 at the first row and third column may be a selected 'erase operation cell'. In this case, a voltage of −2V applied to the word line may be transferred to a floating plate 260 through a control plate 250 to become a potential of the floating plate 260. A voltage of +2V applied to the bit line may be transferred to the tunneling plate 280 to become a potential of the tunneling plate 280. For example, in the even that a voltage across a tunneling capacitor area 290 is measured to be −3.9V, a time taken to perform an erase operation may be about 3 ms.

As a voltage of −2V is applied to a bit line (e.g., a second bit line) and a voltage of +2V is applied to a word line, an EEPROM cell 303 at the third row and first column may be a selected 'write operation cell'. In this case, a voltage of +2V applied to the word line may be transferred to the floating plate 260 through the control plate 250 to become a potential of the floating plate 260, and a voltage of −2V applied to the bit line may be transferred directly to the tunneling plate 280 to become a potential of the tunneling plate 280.

When a voltage of +2V is applied to a bit line (e.g., a second bit line) and a word line, an EEPROM cell 309 at the third row and third column may be an unselected 'write operation cell'. In this case, a voltage difference may be typically generated by charges stored at the floating plate 260. For example, in the even that a voltage across a tunneling capacitor area 290 is measured to be 1.2V, data stored at the EEPROM cell 309 may be retained over 100 years.

If a voltage of 0V is applied to a bit line (e.g., a first or second bit line) and a voltage of +2V is applied to a word line, an EEPROM cell 302 at the second row and first column may be a 'standby operation cell'. In this case, voltage margin of the tunneling plate 280 may increase by influence of a transfer gate 220, so that a voltage difference with the floating plate 260 may be reduced. For example, in case of an erase cell, if it may be lowered to 2.3V by a predetermined voltage (e.g., +0.5V), a stability time of data during a standby operation may increase from 62 seconds to 6300 seconds.

When a voltage of 0V is applied to a bit line (e.g., a first or second bit line) and a voltage of −2V is applied to a word line, an EEPROM cell 308 at the second row and third column may be a 'standby operation cell'. In this case, voltage margin of the tunneling plate 280 may increase by influence of a transfer gate 220, so that a voltage difference with the floating plate 260 may be reduced. For example, in case of a written cell, if it may be increased to −1.6V by a predetermined voltage (e.g., +0.5V), a stability time of data during a standby operation may increase from 6200 seconds to 10 years.

A data disturbance phenomenon at a conventional standby operation, that is, such a phenomenon that erased data is lost within about 63 seconds and written data is lost within about 6300 seconds may be generated. However, in the inventive concept, a voltage approximate to 0V applied through a bit line may be floated using the first transfer gate 220 in which gates of second PMOS and NMOS transistors 221 and 222 are grounded as illustrated in FIG. 2. This may make it possible to increase a stability time of data during a standby operation.

If an appropriate voltage is supplied through an external line, margin for securing stability during a standby operation time may increase. However, a size of an EEPROM cell may increase and a power for an external line and a circuit for controlling a power supply operation may be required. However, as the first transfer gate 220 of the inventive concept is used, stability during a standby operation may be secured without a power supply through an external line. In this case, a size of an EEPROM cell may not increase and a power for an external line and a circuit for controlling a power supply operation may not be required.

The first transfer gate 220 may block an input/output voltage between −Vtn (a threshold voltage of the second NMOS transistor 222) and −Vtp (a threshold voltage of the second PMOS transistor 221) input from bit lines, for example, between −0.5V and +0.5V, and may transfer write and erase voltages ranging from −2V to +2V to the tunneling plate 280.

As described above, high voltages of bit lines (e.g., −2V and +2V) may be transferred to the tunneling plate 280. Thus, the first transfer gate 220 may not affect at write and erase operations. If a voltage of a bit line is 0V at a standby time, the tunneling plate 280 may be blocked and floated. Since the first transfer gate 220 is bidirectional, a voltage of the tunneling plate 280 floated may increase to +0.5V when a voltage of a word line is +2V at a standby time and decrease to −0.5V when a voltage of a word line is −2V. Thus, the tunneling plate 280 may be floated at a standby time and follow a voltage of the floating plate 260 by threshold voltages Vtn and Vtp of transistors, so that a voltage difference causing disturbance is reduced.

An increase in margin of −Vtn (−0.5V) (a threshold voltage of the second NMOS transistor 222) and −Vtp (+0.5V) (a threshold voltage of the second PMOS transistor 221) may amount to nothing when a tunneling insulation film using a voltage difference over 10V is employed. In the inventive concept, however, stability of data during a standby time may be secured when a voltage difference is 4V (+2V to −2V) and a tunneling insulation film has a thickness of about 26 angstroms.

As a result, when a tunneling insulation film thickness is about 26 angstroms, a stabilized time of a standby time at a write/erase operation may increase from 63 seconds to 6300 seconds (about 10 days) at an erased cell and from 6300 seconds to about 10 years at a written cell.

Herein, there is described an example in which threshold voltages of transistors in the first transfer gate 220 are +0.5V and −0.5V. However, if an EEPROM cell fabrication process is below 65 nm and a tunneling insulation film thickness becomes thinner, threshold voltages of transistors may be lower than +0.5V and −0.5V. In this case, a variation in a threshold voltage is small. On the other hand, as an insulation film becomes thin and all voltages are lowered, the same effect may be obtained.

In particular, in the inventive concept, the protection circuit 230 may be additionally used to form all tunneling insulation films of EEPROM cells by a type (e.g., a film having a thickness of about 26 angstroms). Tunneling may be generated at an insulation film of the inverter 210 because a well is adjacent to a floating gate. For this, in a conventional case, a tunneling insulation film having a thickness thicker than about 26 angstroms may be used. However, the inverter 210 may be floated from a power supply voltage Vdd and a ground voltage Vss using the protection circuit 230 including the third PMOS transistor 231 and the third NMOS transistor 232.

The protection circuit 230 may be controlled by an externally applied read voltage Vread. The protection circuit 230 may be floated when a read voltage Vread of 0V is applied at a write/erase operation (including a standby operation of the write/erase operation). If a read voltage Vread of 1V is applied at a sensing operation, the protection circuit 230 may transfer a power supply voltage Vdd of 1V and a ground voltage of 0V to the inverter 210. As a voltage of 0V is applied to selected word line and bit line, an operation may not be affected by a power supply voltage Vdd of 1V and a ground voltage of 0V.

A tunneling capacitor of the inventive concept may be formed of a capacitor between tunneling insulation films, and a size of the tunneling capacitor may be smaller than 10% of a size of a control capacitor. A leakage of charges initially accumulated at a floating gate may be a thermo electron leakage current until 20%. Afterwards, a charge leakage may be accelerated by a stress induced leakage current after 10,000 to 20,000 cycles (writing or erasing). However, electrons may be based on accumulation of trap in an insulation film by a work function. Trip generation may be proportional to a square of a product of strength of a vertical electric field in the tunneling insulation film and a voltage (energy) applied between both ends of the insulation film. In the inverter-embedded EEPROM cell structure of the inventive concept, a voltage may be amplified by an inverter and output to an external bit line, so that the range of fluctuation in write/erase voltage decreases. This may mean that a thin tunneling insulation film of the inventive concept does not cause a variation in strength of an electric field generated in an insulation film. On the other hand, since a voltage across an insulation film is smaller, thermal stability in charge retention may not be deteriorated.

The EEPROM cell of the inventive concept may not be problematic in terms of stability due to external voltage disturbance and thermal stability due to a thin tunneling insulation film.

FIG. 4 is a diagram schematically illustrating a sensing operation of an EEPROM cell array according to an embodiment of the inventive concept. Referring to FIG. 4, an EEPROM cell array 300 may include a plurality of EEPROM cells 301 to 309.

Herein, ΔV may indicate an initial voltage applied between both ends of a tunneling insulation film, a time marked under the initial voltage may indicate a data duration time.

If an initial voltage is '+', a voltage Vfloat.plate of a floating capacitor plate may be higher than a voltage Vtun.plate of a tunneling capacitor plate. In this case, a previously erased cell may be erased.

If an initial voltage is '−', a voltage Vfloat.plate of the floating capacitor plate may be lower than a voltage Vtun.plate of the tunneling capacitor plate. In this case, a previously written cell may be erased.

At a sensing operation, a voltage of 0V may be applied to selected word line and bit line. Also, a voltage of +1V may be applied to a read voltage line corresponding to the selected word line, and a voltage of 0V may be applied to a read voltage line corresponding to an unselected word line. A voltage of 0V may be applied to a first sense gate line connected with a PMOS transistor of a second transfer gate, and a voltage of +1V may be applied to a second sense gate line of an NMOS transistor of the second transfer gate.

A sensing operation may be performed using voltages output through inverters of EEPROM cells 304, 305 and 306 at the second row.

Since a lot of negative charges exist at a floating gate of a written EEPROM cell, a potential of a floating gate may be lowered. If a voltage of a floating gate corresponding to a selected word line does not exceed a logical threshold voltage of an inverter in an EEPROM cell, a power supply voltage Vdd of 1V may be output. On the other hand, a lot of positive charges exist at a floating gate of an erased EEPROM cell, a potential of a floating gate may increase. If a voltage of a floating gate corresponding to a selected word line exceeds a logical threshold voltage of an inverter in an EEPROM cell, a ground voltage Vss of 0V may be output.

That is, if a voltage of 0V is applied to a word line, a center of potential of a floating gate at a write or erase operation may correspond to a logical threshold voltage (e.g., 0.35V) of an inverter at a power supply voltage Vdd of 1V.

In an EEPROM cell array, the protection circuit 230 may block a power supply voltage and a ground voltage applied to an inverter of an unselected cell during a standby time at a write/erase operation or at an operation. An operation may be stabilized by preventing data from being lost due to data disturbance. Also, in the inventive concept, a bit line connected with an EEPROM cell may be split to two bit lines through a first transfer gate. In this case, an externally applied bit line voltage may be divided into two low voltages (e.g., a positive voltage ranging from 0V to +2V and a negative voltage ranging from −2V to 0V), and the two low voltages may be mixed within an EEPROM cell without collision.

In particular, since gates of transistors in the first transfer gate are grounded in common, a line or a control signal generating circuit may not be required.

With the above description, it is possible to fabricate an EEPROM cell using a single insulation film having a thickness less than 70 angstroms (e.g., about 26 angstroms (Å)). This configuration is enable to use all the same gate oxide (i.e. 26 Å) and ultra low operation voltages (i.e. ±2V) in EEPROM cell. Also, an EEPROM cell may be implemented using a process compatible with a CMOS process using a CMOS input/output cell below 65 nm.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. An EEPROM cell, comprising:
   a control gate;
   a tunneling plate;
   a floating plate configured to form a capacitor area with the control plate and the tunneling plate;
   an inverter configured to sense a voltage level of the floating plate;
   a first transfer gate connected with the tunneling plate and configured to transfer an operating voltage selectively applied from first and second bit lines to the tunneling plate;
   a protection circuit connected with sources of the inverter to be floated when performing write and erase operations of an adjacent EEPROM cell; and
   a second transfer gate configured to transfer an output voltage of the inverter.

2. The EEPROM cell of claim 1, wherein the protection circuit comprises:
   a PMOS transistor configured to supply a power supply voltage to the inverter in response to an externally applied read voltage; and
   an NMOS transistors configured to supply a ground voltage to the inverter in response to the externally applied read voltage.

3. The EEPROM cell of claim 2, wherein the PMOS transistor has a gate grounded, a source connected with a read voltage line supplied with the externally applied read voltage, and a drain connected with the inverter and the NMOS transistor has a gate connected with the read voltage line, a source grounded, and a drain connected with the drain of the inverter.

4. The EEPROM cell of claim 3, wherein the PMOS transistor transfers a power supply voltage to the inverter in response to the read voltage at a sensing operation and the NMOS transistor transfer a ground voltage to the inverter in response to the read voltage at the sensing operation.

5. The EEPROM cell of claim 4, wherein at remaining operations excluding the sensing operation, the read voltage has a ground voltage level and a source and a drain of the inverter are floated.

6. The EEPROM cell of claim 1, wherein the first transfer gate comprises:
   a PMOS transistor configured to transfer a voltage of the first bit line to the tunneling plate; and
   an NMOS transistor configured to transfer a voltage of the second bit line to the tunneling plate.

7. The EEPROM cell of claim 6, wherein a positive voltage is applied to the first bit line and a negative voltage is applied to the second bit line.

8. The EEPROM cell of claim 6, wherein when a voltage is applied to one of the first and second bit lines, the other is floated.

9. The EEPROM cell of claim 6, wherein the PMOS transistor has a gate grounded, a source connected with the first bit line, and a drain connected with the tunneling plate and the NMOS transistor has a gate grounded, a source connected with the second bit line, and a drain connected with the tunneling plate.

10. The EEPROM cell of claim 9, wherein outputs of the PMOS and NMOS transistors are prevented from back flow of a signal even though connected to a common tunneling plate line.

11. The EEPROM cell of claim 1, wherein the second transfer gate is connected with a first sense gate line and a second sense gate line and transfers an output voltage of the inverter to a sense line.

12. The EEPROM cell of claim 11, wherein the second transfer gate comprises:
the gate of PMOS transistor connected with the first sense gate line; and
the gate of NMOS transistor connected with the second sense gate line,
wherein at a sensing operation, a ground voltage is applied to the gate of PMOS transistor through the first sense gate line and a power supply voltage is applied to the gate of NMOS transistor through the second sense gate line.

13. The EEPROM cell of claim 12, wherein the PMOS transistor has a drain connected with the inverter, a source connected with the sense line, and a gate connected with the first sense gate line and the NMOS transistor has a source connected with the inverter, a drain connected with the sense line, and a gate connected with the second sense gate line.

14. The EEPROM cell of claim 11, wherein insulation films in elements constituting the inverter, the first and second transfer gates and the protection circuit have the same thickness.

15. The EEPROM cell of claim 14, wherein the insulation film is an gate oxide film and is formed to have a thickness less than about 70 angstroms.

16. An EEPROM device, comprising:
an EEPROM cell array including EEPROM cells arranged in a matrix of rows and columns, each EEPROM cell having an inverter and a transfer gate,
wherein each of the EEPROM cell further includes a protection circuit enabling a tunneling oxide film to be formed with the same thickness as insulation films of the inverter and the transfer gate.

17. The EEPROM device of claim 16, wherein each of the EEPROM cell comprises:
a control gate;
a tunneling plate; and
a floating plate configured to form a capacitor area with the control plate and the tunneling plate, the inverter configured to sense a voltage level of the floating plate.

18. The EEPROM device of claim 17, wherein the protection circuit is connected with a corresponding inverter and floats the corresponding inverter when a corresponding EEPROM cell is not selected.

19. The EEPROM device of claim 18, wherein the protection circuit supplies a voltage of a drain and a source of an inverter only at a read mode and comprises:
a PMOS transistor configured to supply a power supply voltage to the inverter in response to an externally applied read voltage; and
an NMOS transistor configured to supply a ground voltage to the inverter in response to the externally applied read voltage.

20. The EEPROM device of claim 19, wherein the PMOS transistor has a gate grounded, a source connected with a read voltage line supplied with the externally applied read voltage, and a drain connected with the inverter and the NMOS transistor has a gate connected with the read voltage line, a source grounded, and a drain connected with the inverter, the read voltage having a ground voltage level at remaining operations excluding the sensing operation.

* * * * *